(12) United States Patent
Lan et al.

(10) Patent No.: US 9,456,533 B2
(45) Date of Patent: Sep. 27, 2016

(54) SHIELDING DEVICE

(71) Applicant: EZCONN CORPORATION, Taipei (TW)

(72) Inventors: Cheng-Sun Lan, Taipei (TW); Chang-Jie Tsau, Taipei (TW)

(73) Assignee: EZCONN CORPORATION, Taipei (TW)

( * ) Notice: Subject to any disclaimer, the term of this patent is extended or adjusted under 35 U.S.C. 154(b) by 0 days.

(21) Appl. No.: 15/057,235

(22) Filed: Mar. 1, 2016

(65) Prior Publication Data
US 2016/0183417 A1    Jun. 23, 2016

Related U.S. Application Data

(63) Continuation of application No. 12/962,831, filed on Dec. 8, 2010.

(51) Int. Cl.
*H05K 9/00* (2006.01)
*H01R 13/6595* (2011.01)

(52) U.S. Cl.
CPC ........ *H05K 9/0022* (2013.01); *H01R 13/6595* (2013.01); *H05K 9/006* (2013.01); *H05K 9/0026* (2013.01); *H05K 9/0032* (2013.01)

(58) Field of Classification Search
CPC ............. H05K 9/0026; H05K 9/0032; H01R 13/6595
See application file for complete search history.

(56) References Cited

U.S. PATENT DOCUMENTS

| 4,761,712 | A  | * | 8/1988  | Ito ......................... H05K 9/006 361/807 |
| 6,140,977 | A  | * | 10/2000 | Morales ................... H01Q 1/50 343/702 |
| 7,442,881 | B1 | * | 10/2008 | Chien .................. H05K 9/0032 174/377 |
| 7,719,849 | B2 | * | 5/2010  | Blashewski .......... G01R 1/0408 174/50 |
| 7,952,891 | B2 | * | 5/2011  | Tsau ..................... H05K 9/0022 361/799 |
| 2005/0162242 | A1 | * | 7/2005 | Ootori ..................... H04B 1/08 334/85 |
| 2005/0227744 | A1 | * | 10/2005 | Chiang ............. H04N 21/4263 455/575.1 |
| 2006/0252313 | A1 | * | 11/2006 | Ice ....................... G02B 6/3897 439/736 |
| 2006/0255877 | A1 | * | 11/2006 | Jiang ...................... H01P 5/085 333/33 |
| 2010/0176896 | A1 | * | 7/2010  | Payne .................... H01P 5/085 333/33 |
| 2013/0083498 | A1 | * | 4/2013  | Wu ...................... H05K 9/0032 361/752 |
| 2013/0241374 | A1 | * | 9/2013  | Tsao .................... H05K 5/0004 312/223.1 |
| 2015/0155662 | A1 | * | 6/2015  | Lapidot ................. H01R 4/028 439/581 |

* cited by examiner

*Primary Examiner* — Hung V Ngo

(57) ABSTRACT

A shielding device includes a frame body and a connector. The frame body is composed of multiple sideboards. One of the sideboards is formed with a receiving hole and at least three arcuate slots. The connector has a main body section, a connection end section and at least three arcuate protrusions. The three arcuate protrusions are formed on an end face of the main body section at a front end of the connector corresponding to the arcuate slots. The arcuate protrusions are fixedly installed in the arcuate slots of the frame body to securely connect the connector with the frame body. Accordingly, the shielding device meets the requirement for high torque specification.

20 Claims, 4 Drawing Sheets

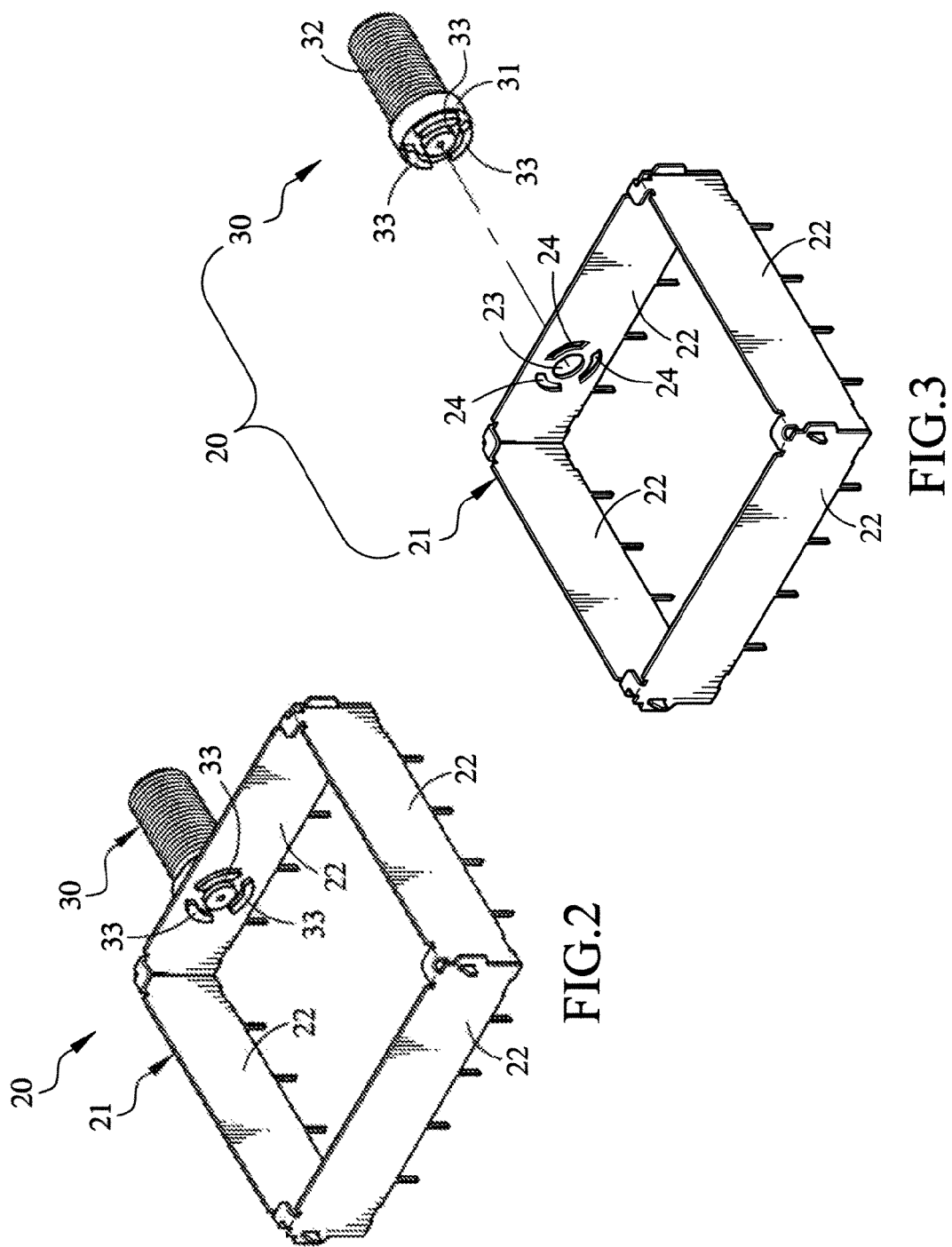

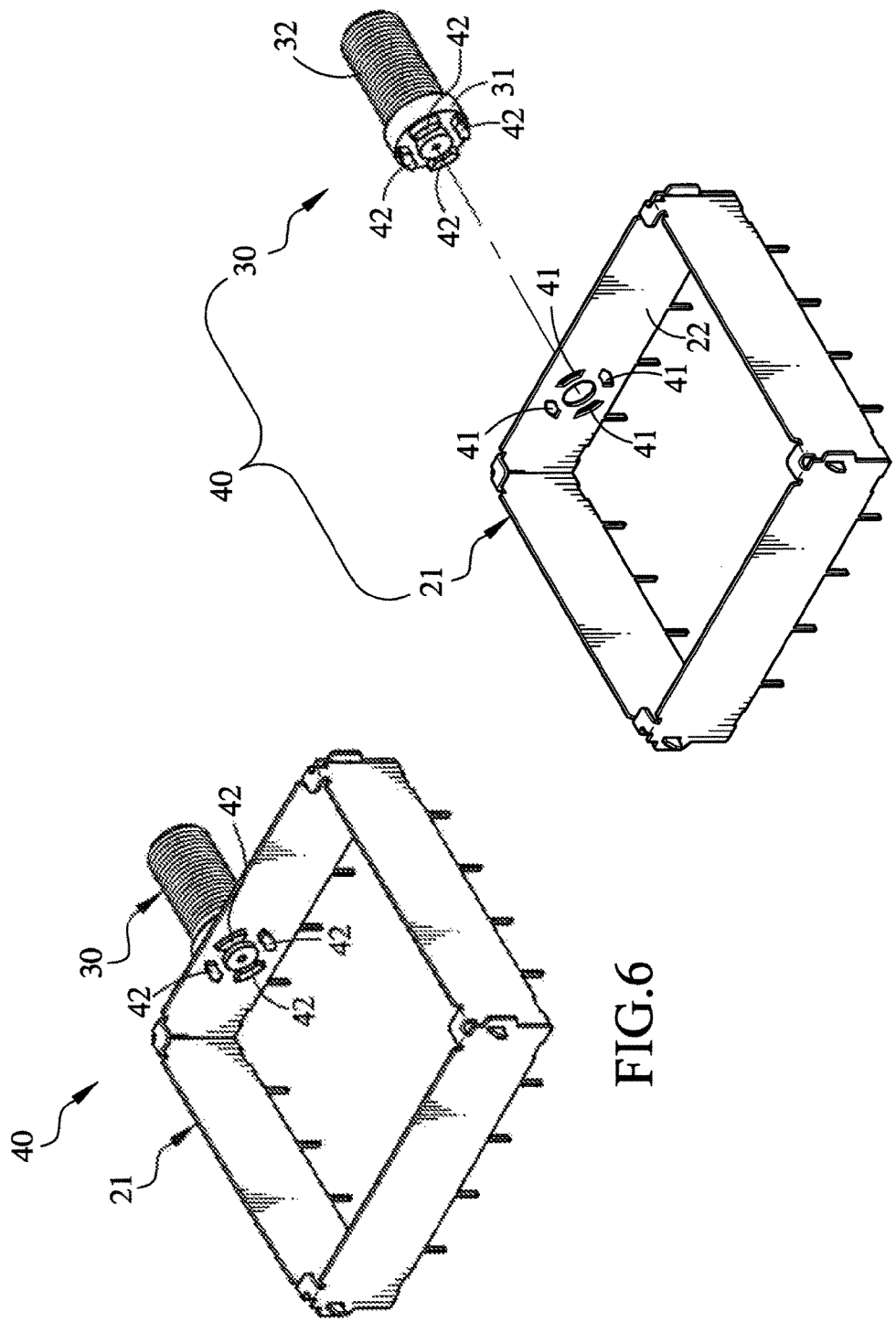

SHIELDING DEVICE

This application is a continuation of application Ser. No. 12/962,831, filed on Dec. 8, 2010, now pending.

BACKGROUND OF THE INVENTION

1. Field of the Invention

The present invention relates generally to a shielding device, and more particularly to a shielding device with high torque.

2. Description of the Related Art

FIGS. 1A and 1B show a conventional shielding device 10, which is affixed to a circuit board by means of soldering. The shielding device 10 includes a frame body 11 connected with a connector 12 for signal input/output. The frame body 11 is formed with a connection hole 13 for receiving therein an end protrusion 14 of the connector 12. After the end protrusion 14 is fitted into the connection hole 13, the end protrusion 14 is riveted to connect the connector 12 with the frame body 11. The frame body 11 and the connector 12 are simply connected by means of riveting so that the shielding device 10 can only have a torque value up to 30-40 kg-cm. This only meets the requirement for low torque specification, while failing to meet the high torque specification regulated by Society of Cable Television Engineers (SCTE), which is over 41 kg-cm.

To overcome the above problem, the junction between the frame body 11 and the connector 12 can be manually welded to increase the torque of the conventional shielding device. However, such solution will lead to deformation of the frame body 11. Moreover, the additional reinforcing operation will cause extra cost and increase of working time.

SUMMARY OF THE INVENTION

A primary object of the present invention is to provide a shielding device with high torque.

To achieve the above and other objects, shielding device of the present invention includes a frame body and a connector. The frame body is composed of multiple sideboards. One of the sideboards is formed with a receiving hole and at least three arcuate slots formed around the receiving hole. The connector has a main body section, a connection end section and at least three arcuate protrusions. The three arcuate protrusions are formed on an end face of the main body section at a front end of the connector corresponding to the arcuate slots. The arcuate protrusions are installed into the arcuate slots of the frame body and then riveted to securely connect the connector with the frame body. The arcuate protrusions of the connector are assembled in the arcuate slots of the frame body to securely connect the connector with the frame body, whereby the shielding device can have a torque value over 60 kg-cm. The shielding device of the present invention meets the requirement for high torque specification.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 2 is a perspective assembled view of a first embodiment of the present invention;

FIG. 3 is a perspective exploded view of the first embodiment of the present invention;

FIG. 6 is a perspective assembled view of a second embodiment of the shielding device of the present invention, showing that four arcuate slots are formed on a sideboard of the frame body and the connector has four arcuate protrusions corresponding to the four arcuate slots; and FIG. 7 is a perspective exploded view according to FIG. 6.

DETAILED DESCRIPTION OF THE PREFERRED EMBODIMENTS

Please refer to FIG. 2. The shielding device 20 of the present invention includes a frame body 21 mountable on a circuit board. The frame body 21 is connected to a connector 30 for signal input/output.

Figure 4:
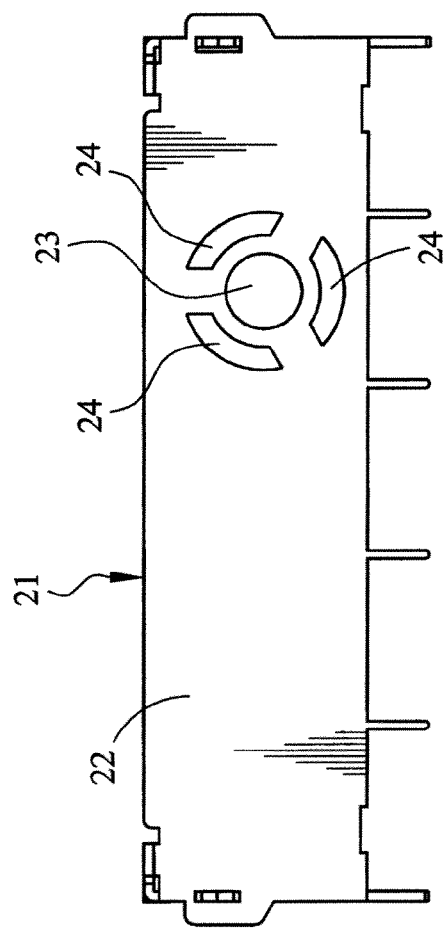
FIG. 4 is a rear view of the frame body of the present invention.

The configuration of the frame body 21 can be designed according to the requirement of the manufacturer. In this embodiment, the frame body 21 has the form of a rectangular solid. The frame body 21 is composed of four sideboards 22. One of the four sideboards is formed with a receiving hole 23 and at least three arcuate slots 24. As shown in FIGS. 3 and 4, the three arcuate slots 24 are formed around the receiving hole 23 at equal intervals.

Figures 1A, 1B:
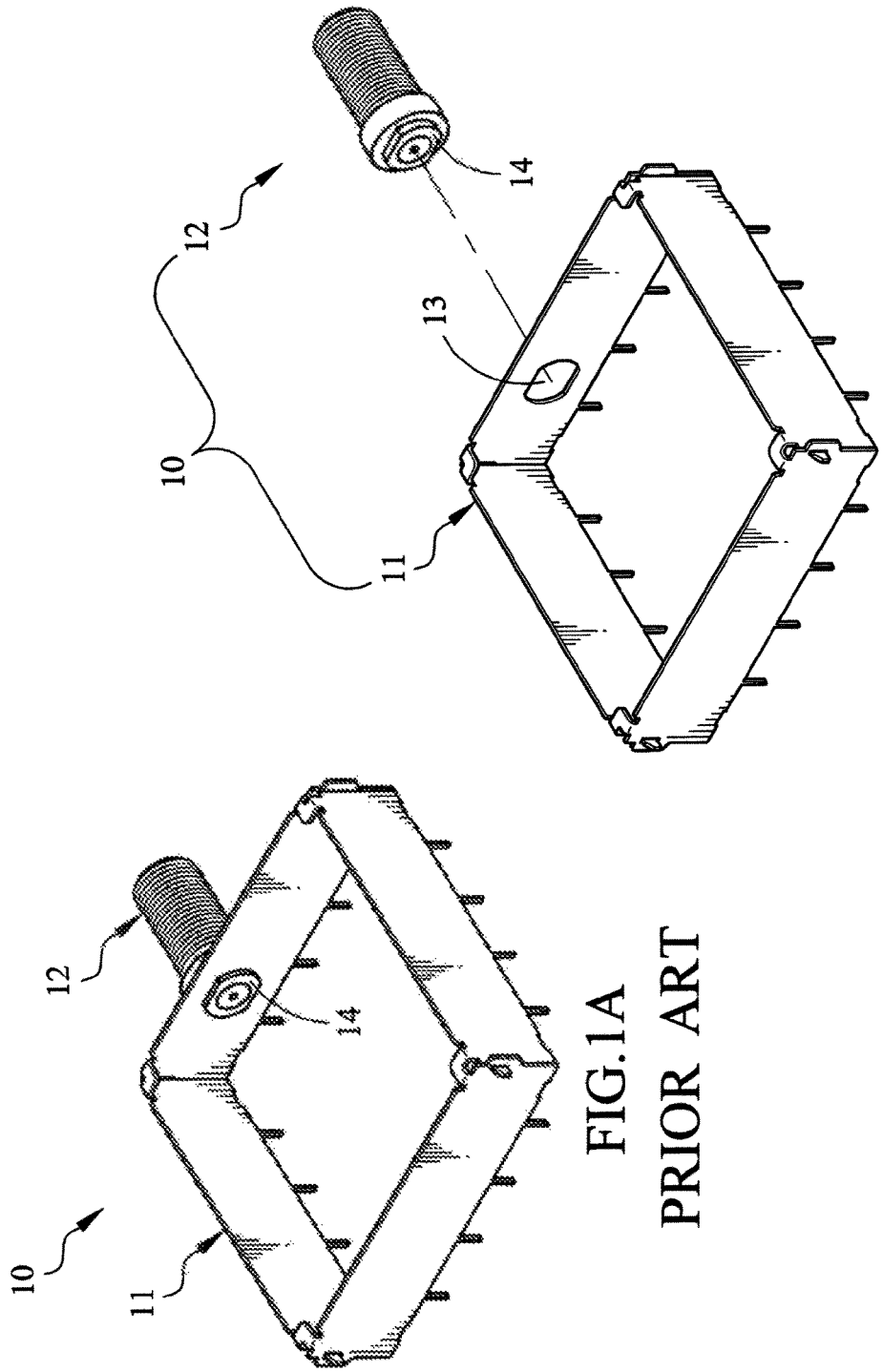
FIGS. 1A and 1B are a perspective assembled view and a perspective exploded view of a conventional shielding device respectively.
Figure 5:
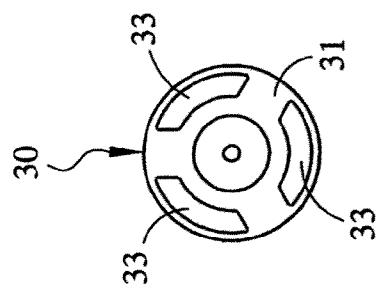
FIG. 5 is a front view of the connector of the present invention.

The connector 30 has a main body section 31, a connection end section 32 and multiple arcuate protrusions 33. Referring to FIGS. 3 and 5, there are three arcuate protrusions 33 formed on an end face of the main body section 31 at a front end of the connector 30 corresponding to the arcuate slots 24. The arcuate protrusions 33 can be installed into the arcuate slots 24 of the frame body 21 and then riveted to securely connect the connector 30 with the frame body 21 as shown in FIG. 2.

An outer surface of the connection end section 32 is formed with a thread for locking with a coupling connector and mechanically and electrically connecting with the coupling connector.

The present invention is characterized in that the three arcuate protrusions 33 of the connector 30 are assembled in the three arcuate slots 24 of the frame body 21 to securely connect the connector 30 with the frame body 21. The shielding device 20 of the present invention can have a torque value over 60 kg-cm. The shielding device 20 of the present invention meets the requirement for high torque specification.

FIGS. 6 and 7 show a second embodiment of the present invention, in which the same components are denoted by the same reference numerals as in the first embodiment. The second embodiment is different from the first embodiment in that a different number of arcuate slots are formed on the sideboard of the shielding device 40. Preferably, four arcuate slots 41 are formed on the sideboard 22 of the shielding device 40 around the receiving hole 23 at equal intervals. The connector 30 has four arcuate protrusions 42 formed on the end face of the main body section 31 corresponding to the arcuate slots 41. The four arcuate protrusions 42 are assembled in the four arcuate slots 41 to securely connect the connector 30 with the frame body 21. Also, the shielding device 40 of the present invention can have a torque value over 60 kg-cm.

In conclusion, the shielding device 20, 40 of the present invention meets the requirement for high torque specification without any additional reinforcing measure.

The above embodiments are only used to illustrate the present invention, not intended to limit the scope thereof. It is understood that many changes or modifications of the above embodiments can be made by those who are skilled in this field without departing from the spirit of the present invention. The scope of the present invention is limited only by the appended claims.

What is claimed is:

1. A shielding device configured to be fixed with a circuit board, comprising:
a frame body comprising a sideboard standing at a side of said frame body, wherein a receiving hole and multiple arcuate slots around said receiving hole are at said sideboard, wherein said arcuate slots and said receiving hole are separated from one another by a piece of said sideboard; and
a connector fixed with said sideboard, wherein said connector comprises a protruding portion protruding from a planar surface of said connector and passing through said receiving hole and multiple arcuate protrusions protruding from said planar surface of said connector and around said protruding portion of said connector, wherein said arcuate protrusions pass through said arcuate slots respectively, wherein said connector comprises a round cylinder with a thread on an outer surface of said round cylinder, wherein one of said arcuate protrusions comprises a first arcuate sidewall and a second arcuate sidewall, wherein a first radial gap between said first arcuate sidewall and a sidewall of said round cylinder has a distance is smaller than that of a second radial gap between said second arcuate sidewall and a sidewall of said protruding portion, and wherein said first and second radial gaps are over said planar surface.

2. The shielding device of claim 1, wherein each of said arcuate protrusions extends along the circumference of a circle.

3. The shielding device of claim 1, wherein said arcuate protrusions are riveted to said arcuate slots.

4. The shielding device of claim 1, wherein said protruding portion has a perfectly circular periphery.

5. The connector of claim 1, wherein said planar surface has a perfectly circular periphery.

6. A connector configured to be fixed with a board, comprising a protruding portion protruding from a planar surface of said connector and a first protrusion protruding from said planar surface of said connector, wherein said first protrusion comprises a first arcuate sidewall and a second arcuate sidewall, wherein said protruding portion and said first protrusion are fixed with said connector before said connector is fixed with said board, wherein said connector comprises a round cylinder with a thread on an outer surface of said round cylinder, wherein a first radial gap between a sidewall of said round cylinder and said first arcuate sidewall has a distance is smaller than that of a second radial gap between said second arcuate sidewall and a sidewall of said protruding portion, and wherein said first and second radial gaps are over said planar surface.

7. The connector of claim 6, wherein said planar surface of said connector is substantially normal to an axis of said round cylinder of said connector.

8. The connector of claim 6, wherein said first protrusion extends in a curve on said planar surface.

9. The connector of claim 6, wherein said protruding portion has a perfectly circular periphery.

10. The connector of claim 6 further comprising a second protrusion protruding from said planar surface of said connector, wherein a second radial gap between said second protrusion and said protruding portion is over said planar surface, wherein said first and second protrusions extend along the circumference of a circle, wherein an actuate gap between said first and second protrusions extends along the circumference of said circle and over said planar surface, wherein said second protrusion is fixed with said connector before said connector is fixed with said board.

11. The connector of claim 6 further comprising a second protrusion protruding from said planar surface of said connector, and a third protrusion protruding from said planar surface of said connector, wherein said first, second and third protrusions are around said protruding portion, wherein a second radial gap between said second protrusion and said protruding portion is over said planar surface, wherein a third radial gap between said third protrusion and said protruding portion is over said planar surface, wherein a first actuate gap between said first and second protrusions extends along the circumference of said circle and over said planar surface, and a second actuate gap between said first and third protrusions extends along the circumference of said circle and over said planar surface, wherein said second and third protrusions are fixed with said connector before said connector is fixed with said board.

12. The connector of claim 6, wherein said planar surface has a perfectly circular periphery.

13. The connector of claim 6, wherein said first protrusion extends in an arc on said planar surface.

14. The connector of claim 6, wherein said first protrusion is configured to be riveted to a hole in said board.

15. A connector configured to be fixed with a board, comprising a protruding portion protruding from a planar surface of said connector and multiple arcuate protrusions protruding from said planar surface of said connector and around said protruding portion of said connector, wherein said arcuate protrusions extend along the circumference of a circle, wherein an actuate gap between adjacent two of said arcuate protrusions extends along the circumference of said circle and over said planar surface, wherein said protruding portion and said arcuate protrusions are fixed with said connector before said connector is fixed with said board, wherein said connector comprises a round cylinder with a thread on an outer surface of said round cylinder, wherein a first radial gap between a sidewall of said round cylinder and said first arcuate sidewall has a distance is smaller than that of a second radial gap between said second arcuate sidewall and a sidewall of said protruding portion, and wherein said first and second radial gaps are over said planar surface.

16. The connector of claim 15, wherein said protruding portion has a perfectly circular periphery.

17. The connector of claim 15, wherein said arcuate protrusions comprise three arcuate protrusions protruding from said planar surface of said connector and around said protruding portion of said connector.

18. The connector of claim 15, wherein said planar surface has a perfectly circular periphery.

19. The connector of claim 15, wherein said planar surface of said connector is substantially normal to an axis of said round cylinder of said connector.

20. The connector of claim 15, wherein said arcuate protrusions are configured to be riveted to multiple arcuate slots in said board.

* * * * *